Figure 1:
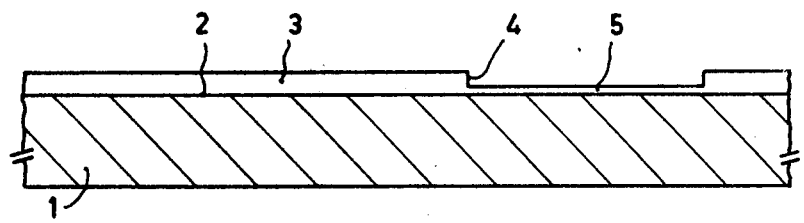
Figure 2:
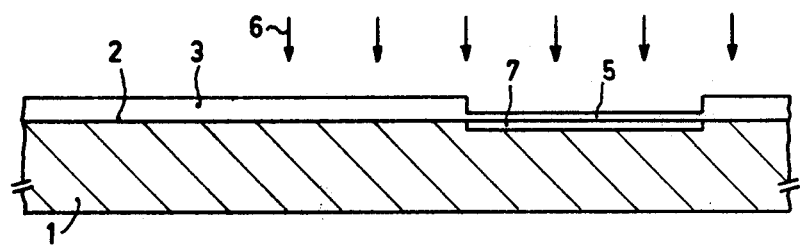
Figure 3:
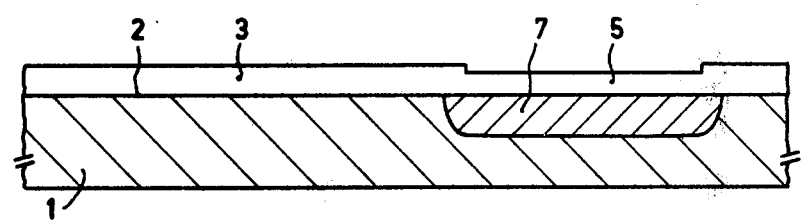
Figure 4:
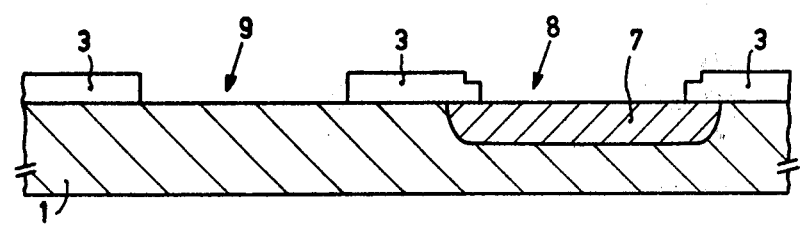
Figure 5:
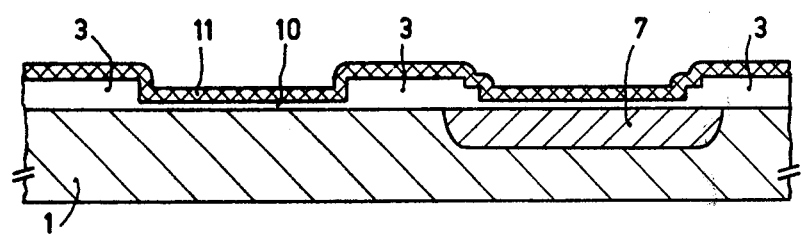
Figure 6:
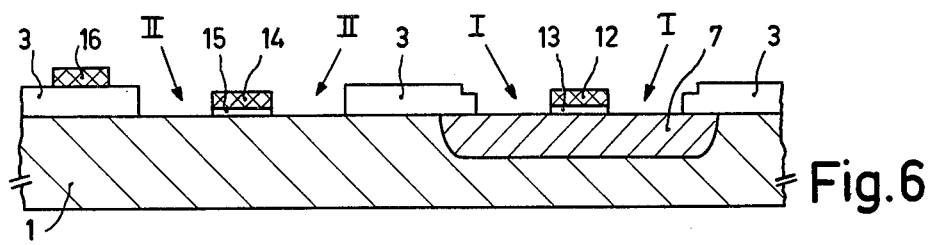

United States Patent [19]

Steinmaier et al.

[11] 4,139,402
[45] Feb. 13, 1979

[54] METHOD OF MANUFACTURING A SEMICONDUCTOR DEVICE UTILIZING DOPED OXIDES AND CONTROLLED OXIDATION

[75] Inventors: Walter Steinmaier, Langnau; Jose Soló de Zaldivar, Wädenswill, both of Switzerland

[73] Assignee: U.S. Philips Corporation, New York, N.Y.

[21] Appl. No.: 787,029

[22] Filed: Apr. 13, 1977

[30] Foreign Application Priority Data

May 11, 1976 [NL] Netherlands .................. 7604986

[51] Int. Cl.² ................... H01L 21/225; H01L 29/78
[52] U.S. Cl. ................................. 148/188; 29/571; 29/578; 148/1.5; 148/187; 156/644; 156/654; 156/657; 156/662; 357/23; 357/42; 357/54
[58] Field of Search ................... 148/187, 188, 1.5; 29/571, 578; 357/23, 42, 54; 156/644, 654, 657, 662

[56] References Cited

U.S. PATENT DOCUMENTS

| 3,312,577 | 4/1967 | Dunster et al. | 148/187 |
| 3,418,180 | 12/1968 | Ku | 148/187 |
| 3,507,716 | 4/1970 | Nishida et al. | 148/188 X |
| 3,574,009 | 4/1971 | Chizinsky et al. | 148/188 X |
| 3,690,969 | 9/1972 | Hays et al. | 148/188 |
| 3,765,963 | 10/1973 | Okabe et al. | 148/188 |
| 3,798,081 | 3/1974 | Beyer | 148/188 |
| 3,806,382 | 4/1974 | Fitzgibbons et al. | 148/188 |
| 3,921,283 | 11/1975 | Shappir | 357/42 X |
| 3,932,239 | 1/1976 | Brown | 148/188 X |
| 3,986,896 | 10/1976 | Ueno et al. | 148/188 X |

OTHER PUBLICATIONS

Whittle et al., "Control of Boron Diffusion ... Borosilicate Glass Source", J. Electrochem. Soc., vol. 116, No. 5, May 1969, pp. 645-648.
Carlsen, G. S., "Multiple Diffusion ... From Single Diffusion", I.B.M. Tech. Discl. Bull., vol. 9, no. 10, Mar. 1967, pp. 1456-1458.
Forneris et al., "Oxide Capping for Thermal Drive-In", IBID., vol. 19, no. 5, Oct. 1976, p. 1703.

Primary Examiner—L. Dewayne Rutledge
Assistant Examiner—W. G. Saba
Attorney, Agent, or Firm—Thomas A. Broidy; Steven R. Biren

[57] ABSTRACT

A method of manufacturing a semiconductor device, in particular a device having two complementary insulated gate field effect transistors, in which an aperture is provided in a masking layer and in said aperture a zone is diffused in the body from a highly doped layer, in particular a phosphorus glass layer. According to the invention, a thermal oxide layer is formed in the aperture in a first heating step during the diffusion, after which the doping layer is removed without using a mask and while maintaining the thermal oxide layer, and the dopant is then further diffused in a second heating step. The thermal oxide layer serves as a partial masking against the diffusion, as an etchant stopper and in many cases also as a mask against ion implantation.

12 Claims, 15 Drawing Figures

METHOD OF MANUFACTURING A SEMICONDUCTOR DEVICE UTILIZING DOPED OXIDES AND CONTROLLED OXIDATION

The invention relates to a method of manufacturing a semiconductor device in which a layer masking against diffusion is provided on a surface of a semiconductor body, in which masking layer at least one aperture is provided, after which a doping layer containing a dopant is provided at least within said aperture on the semiconductor surface, after which the dopant is diffused into the semiconductor body from the doping layer via the said aperture by heating so as to form a doped zone having different conductivity properties with respect to the adjoining semiconductor material, and the doping layer is then removed.

The invention furthermore relates to a semiconductor device manufactured by using the method.

The term "different conductivity properties" is to be understood in this application to mean different conductivity types and/or different resistivities.

A method as described above is known in semiconductor technology, in particular for the manufacture of monolithic integrated circuits, and is used in different forms.

In the known methods of the kind described the drawback often occurs that contradictory requirements have to be imposed upon the doping of the doping layer. This is the case notably when the doping zone should not be too deep. If for that purpose the doping of the doping layer is made rather low, the doping layer (usually a doped silicon oxide layer) is difficult to remove by etching since the etching rate thereof is low. In order to prevent the insulating layer present on the surface (usually an undoped silicon oxide layer) in which the aperture is provided from being attacked too strongly by said etching process, the removal of the doping layer can at any rate not be carried out without a mask. This would be possible indeed if the doping layer were highly doped but in this case too large a depth of penetration of the doped zone would occur.

Still other drawbacks present themselves in the important, frequently occurring case in which at least a first and at least a second aperture are provided in the insulating layer, after which a first dopant is provided in the underlying semiconductor body via the first aperture and a second dopant is provided in the underlying semiconductor body via the second aperture, in which said doping at least within the first aperture takes place by diffusion from a doped layer. In general, both the doping via the first aperture and that via the second aperture are generally carried out by means of a diffusion process. In practice various difficulties may occur which render the method unfit for a number of purposes. A frequently occurring drawback is the fact that during one or both diffusions a type of glass which is difficult to remove, for example boron glass, is formed on the semiconductor surface. Furthermore, it often occurs that the doped layer from which at least one of the diffusions is carried out remains present on the surface until at least after the formation of the said first and second zones in their ultimate form. This gives rise to rather large thickness differences ("steps") in the insulating layer ultimately present on the semiconductor surface. If it is not desired to remove the whole insulation layer and to replace it by a fresh one (in which process the p-n junctions terminating at the surface are exposed so that the electrical properties thereof can be detrimentally influenced), one is compelled to etch the necessary contact windows through the nonuniform insulation layer. This generally requires several etching and masking steps in order to avoid undesired attack of certain parts of the insulation layer, and in particular underetching of the thinner parts of the insulating layer.

A first object of the invention is to provide a method in which comparatively shallow diffused zones can be provided by diffusion from a doped layer, which layer can be removed without using a mask and without attacking further insulation layers present on the semiconductor surface.

A further object of the invention, in the case in which via first and second apertures in the insulating layer first and second dopants, respectively, are provided in the semiconductor body, in particular to manufacture a semiconductor device having complementary insulated gate field effect transistors, is to provide a method in which at the same time an everywhere substantially equally thick insulation layer is present at the end of the process so that all contact windows can be provided in one etching step without a danger of underetching, and in addition no glass layers are formed which are difficult to remove.

The invention is inter alia based on the recognition that the said objects can be achieved by suitably using a thermal oxide layer which is formed within the said apertures during the process.

The invention is also based on the recognition that in the case of the provision of several dopants via several apertures, said dopants are advantageously provided by means of different techniques.

For that purpose a method of the kind mentioned above is characterized according to the invention in that a first heating step is carried out in an oxidizing atmosphere in which a part of the dopant diffuses in the semiconductor body and the semiconductor surface situated within the aperture is also covered with a thermal oxide layer by oxidation, that the doping layer is then removed by etching without using an etching mask for the adjacent layer portions, the said masking layer and said thermal oxide layer being removed at most over only part of their thickness by said etching process due to the higher etch rate of said doping layer, and that the dopant is then further diffused into the semiconductor body during a second heating step.

In the method according to the invention the said thermal oxide layer first of all has an inhibiting effect on the diffusion from the doping layer. As a result of this a doping layer having a high doping concentration can be used without thereby obtaining too deep a doped zone. Furthermore, said highly doped doping layer, for example a highly doped phosphorus-glass layer, which has a high etching rate can easily be removed by etching without a mask and without attacking other insulation layers. The said thermal oxide layer which has a comparatively low etching rate results in the etching time being not critical, since said thermal oxide layer is substantially maintained even when the etching time required for removing the doping layer is exceeded.

A very important preferred embodiment of the method according to the invention is characterized in that at least a first and at least a second aperture are provided in the masking layer and that the doping layer is provided only in the first aperture, in which during the performance of the first heating step the thermal oxide layer is formed within the first and second apertures, that after the first heating step a second dopant is provided by ion implantation via the second aperture and the thermal oxide layer formed therein to form a second doped zone, said doping layer masking against said ion implantation, after which during the second heating step the second dopant is further diffused in the semiconductor body simultaneously with the first dopant. The said thermal oxide layer also serves to protect the semiconductor surface within the second apertures against damage by ion implantation.

Of particular importance is the case in which the starting material is a semiconductor body having a surface-adjoining first region of the second conductivity type which within the semiconductor body is surrounded entirely by a likewise surface-adjoining second region of the first conductivity type, that at least two first apertures are provided above the first region to form at least the source and drain zones of a first insulated gate field effect transistor, and that at least two second apertures are provided above the second region to form at least the source and drain zones of a second insulated gate field effect transistor which is complementary to the first, and that the said masking layer is formed by insulating layer portions present outside the first and second apertures and by insulated gate electrodes which separate the first apertures mutually and separate the second apertures mutually from each other.

Figure 11:
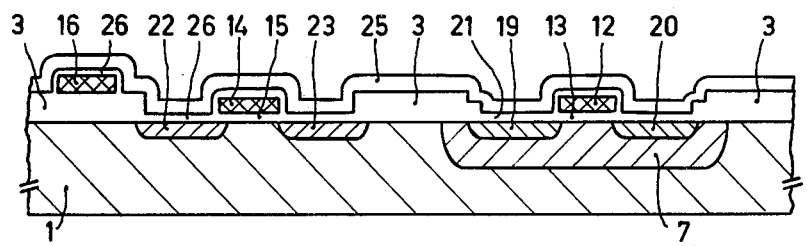
Figure 12:
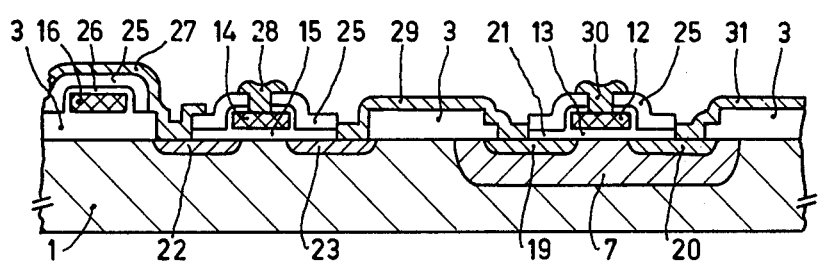
Figure 13:
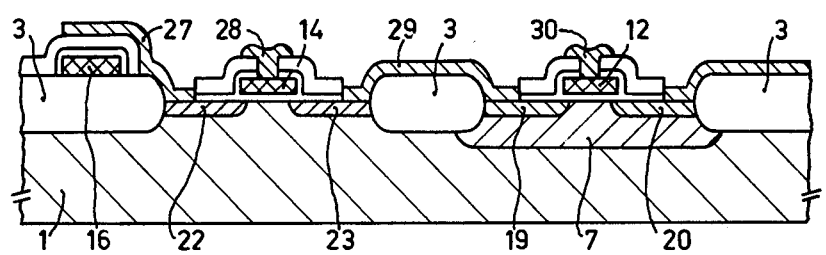

The invention will now be described in greater detail with reference to an embodiment and the drawing, in which:

FIGS. 1 to 12 are diagrammatic cross-sectional views of a semiconductor device in successive stages of manufacture by using the method according to the invention, FIG. 13 is a diagrammatic cross-sectional view of a semiconductor device manufactured by means of a variation in the method according to FIGS. 1 to 12, and FIGS. 14 and 15 show two successive stages of a very simple embodiment of the method according to the invention.

The Figures are purely diagrammatic and not drawn to scale. Corresponding parts are generally referred to by the same reference numerals.

FIGS. 1 to 12 are diagrammatic cross-sectional views of a semiconductor device in successive stages of the method according to the invention. In this example a semiconductor device is manufactured having two complementary insulated gate field effect transistors. However, the invention is not restricted thereto. Starting material is, for example, a semiconductor body in the form of an n-type conductive silicon plate 1 having a resistivity of approximately 5 Ohm.cm and a thickness of approximately 450 microns. An insulating layer 3 of silicon oxide, for example 0.6 micron thick, is provided on a surface of said plate by thermal oxidation (see FIG. 1). A window 4 is then etched in said layer 3, after which by thermal oxidation a thinner oxide layer 5, for example 0.1 micron thick, is provided in said window. By implantation of boron ions in the direction of the arrows 6 (see FIG. 2) via the layer 5 with an energy of approximately 80 keV and a dose of $5 \times 10^{12}$ atoms per cm$^2$, a shallow p-type region 7 is then formed. By heating in an oxidizing atmosphere the layer 7 is then diffused deeper into the body in which by thermal oxidation the oxide layers 3 and 5 grow on the whole surface to an overall thickness of approximately 1 micron, the layer 5 remaining slightly thinner than the layer 3, see FIG. 3. The thickness of the region 7 is now 4 to 5 microns and as a result of out-diffusion of boron atoms from the region 7 into the oxide layer 5, the region 7 obtains a doping profile in which the maximum boron doping is at some distance from the surface 2. Windows 8 and 9 are then etched in the oxide layer (3, 5), the window 8 being situated entirely above the p-type region 7 and the window 9 being situated entirely above the n-type region 1, see FIG. 4.

The above-mentioned oxidation, diffusion and etching processes are conventionally used in semiconductor technology and may be carried out in various manners. They constitute no essential feature of the invention and will therefore not be described in detail.

A thin oxide layer 10, thickness approximately 0.1 micron, is then formed within the window 8 and 9 also in usual manner by thermal oxidation. On this layer is deposited in known manner by chemical conversion of SiH$_4$ a layer 11 of polycrystalline silicon, thickness approximately 0.5 micron, see FIG. 5. By using known, for example photolithographic etching methods, the layers 11 and 10 are then given the desired shape, the gate electrodes 12 and 14 with the gate oxide layers 13 and 15 as well interconnection patterns 16 being obtained, see FIG. 6. First apertures I are formed above the region 7 and second apertures II are formed above the region 1 in a layer masking against diffusion and against ion implantation, which layer is formed by the oxide layer (3, 5) and the insulated gate electrode (12, 13) and (14, 15). Via the first aperture I a first dopant to form n-type first zones 19 and 20, and via the second apertures II a second dopant to form p-type second zones 22 and 23 in the underlying semiconductor body are now provided in which said doping takes place within the first apertures I by diffusion from a doped layer 17 (see FIGS. 7 to 12). Both the first zones 19 and 20 and the second zones 22 and 23 have different conductivity properties with respect to the adjoining semiconductor material, namely in this example both a different conductivity type and a different (lower) resistivity. According to the invention the doping is carried out as follows.

Figure 7:
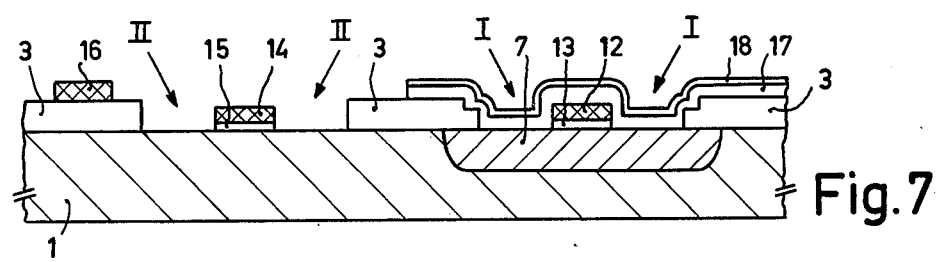
Figure 8:
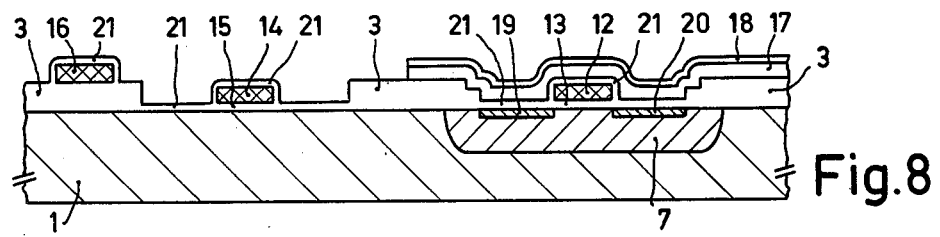
Figure 9:
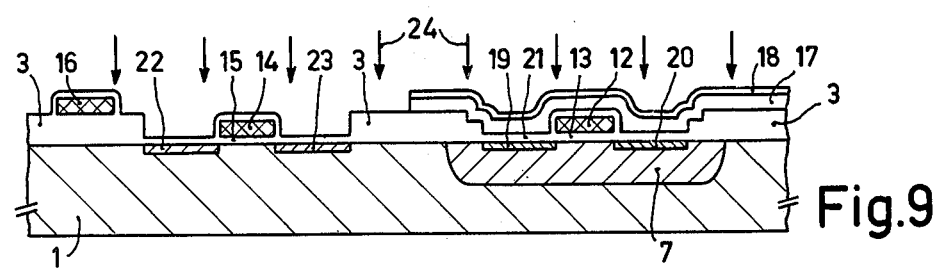
Figure 10:
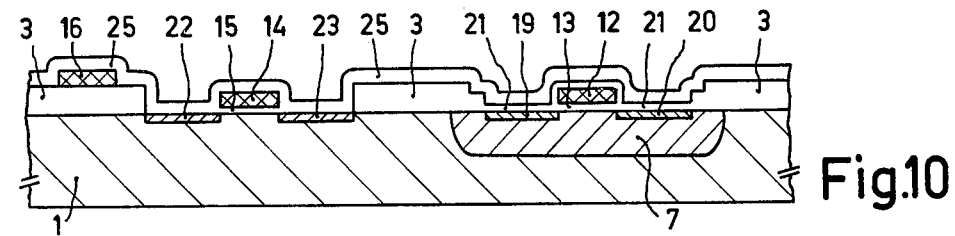

The first apertures I are first covered with a doping layer 17 which contains phosphorus atoms, see FIG. 7. For that purpose a doping layer 17 of doped silicon oxide is deposited pyrolytically, for example, by thermal decomposition of SiH$_4$ to which, for example 10% by volume of PH$_3$ have been added. In order to prevent phosphorus from diffusing from the layer 17 into the atmosphere and penetrating elsewhere in the semiconductor surface during the subsequent operations, an undoped oxide layer 18 is deposited preferably on said doping layer 17 in the same operational step by discontinuing the addition of PH$_3$. The doping layer should be sufficiently thick to mask against ion implantation; in this Example the layer 17 has a thickness of approximately 0.4 micron and the layer 18 has a thickness of approximately 0.1 micron. The layers are deposited at a rate of approximately 0.05 micron per minute. The part of the layers 17 and 18 which is present above the second apertures II is then removed by means of a photolacquer mask whose dimensions need not be accurately defined. After removing the layer of photolaquer the structure shown in FIG. 7 is obtained.

A heating in an oxidizing atmosphere is then carried out in which a part of the dopant, in this Example phosphorus, diffuses from the doping layer 17 via the first apertures I into the semiconductor surface and forms there highly doped n-type source and drain zones 19 and 20. This is carried out, for example, by heating in an atomsphere containing nitrogen and oxygen in a volume ratio of approximately 1 to 3, for approximately 50 minutes at 950° C. According to the invention the semiconductor surface situated within the first and second apertures I and II is also covered by thermal oxidation with a thermal silicon oxide layer 21, approximately 0.09 micron thick, see FIG. 8. During said oxidation the oxide layer 21 is also formed on the polycrystalline electrode layers and interconnection layers 12, 14 and 16.

Via the second apertures II and the oxide layer 21 formed therein, boron ions are then provided in the semiconductor surface by ion implantation (in the direction of the arrows 24 in FIG. 9), the doping layer 17 masking against said in implantation. In this Example the implantation is carried out with an energy of 80 keV and a dose of $5 \times 10^{14}$ ions per cm$^2$. Furthermore, the oxide layer 3 and the insulated gate electrode (14, 15) also mask against said ion implantation. Highly doped p-type source and drain zones 22 and 23 are formed, see FIG. 9. It is to be noted that when in this application the word "masking" is used, said masking need not necessarily be absolute but should at least be sufficient to be certain that in the surface situated below the masking layer no undesired doping variation, for example inversion of the conductivity type, occurs.

The doping layer 17 with the undoped oxide layer 18 present thereon can now be removed by etching by means of a HP-containing solution without using an etching mask for the adjacent layer portions. The thin oxide layer 21 on the p-type zones 22 and 23 is also removed. The oxide layer 21 on the n-type zones 19 and 20 remains for the greater part. This removal of the doping layer without an etching mask is enabled by the presence of the thermal oxide layer 21. This layer as a matter of fact has a treble purpose. In order to be able to remove the thick doping layer (17, 18) by etching without considerably attacking the oxide layer 3 it is necessary for the doping of the layer 17 to be high so that the etching rate is also large as compared with that of thermal oxide. Without the presence of the thermal oxide layer 21 on the zones 19 and 29, said zones as a result of said high doping of the layer 17 would diffuse too deeply in the region 7. This is prevented by the inhibiting effect of the layer 21. Moreover, the thermal oxide layer 21 serves as an etchant stopper during the removal of the doping layer, since the etching rate of the thermal oxide 21 is much smaller than that of the layer 17 and said layer 21 hence masks at least partly against said etching process. Without the presence of the oxide layer 21 and etching mask would be indispensable for the removal of the doping layer. Furthermore, the oxide layer 21 served earlier during the boron implantation as a protective layer to keep the silicon surface free from dislocations as much as possible.

Preferably, a passivating and gettering step is then carried out. For that purpose, an undoped silicon oxide layer 25 (see FIG. 10), approximately 0.35 micron thick, is deposited pyrolytically, after which the assembly is heated at approximately 1000° C. for approximately 30 minutes in an atmosphere containing a small quantity of PH$_3$.

During a further heating step, the phosphorus and boron dopings of the zones 19, 20, 22 and 23 are then simultaneously diffused further into the semiconductor body so as to give said zones their definite shape and depth. In this Example said heating step is carried out at approximately 1050° C. for approximately 25 minutes in an atmosphere containing nitrogen and oxygen. An approximately 0.07 micron thick thermal oxide layer 26 is also formed by oxidation of the zones 22 and 23 on the polycrystalline gate electrode layer 14 and on the interconnection layer 16, see FIG. 11. The ultimately obtained thickness of the n-type source and drain regions 19 and 20 is approximately 1.4 microns and that of the p-type source and drain zones 22 and 23 is approximately 1.2 microns.

As shown in FIG. 11, insulation layers of substantially equal thickness and composition are present on the zones 19, 20, 22 and 23 as well as on the gate electrode layers 12 and 14 and on the interconnection layers 16. This makes the etching of the required contact windows very simple since they can all be formed simultaneously in one masking and etching step in the usual manner without a danger of too strong an attack of the layer 3 and of underetching problems, after which the contact layers 27 and 31 can also be provided in the usual manner, for example, in the form of aluminium layers. As shown in FIG. 12, said metallization (27) may partly be present above the interconnections (16), so that a two-layer-interconnection is obtained, in which the two interconnection levels may contact each other, if desired, locally via the layers 25 and 26.

Finally, if desired, a protective layer, for example a glass layer, is provided over the assembly after which the resulting device may be mounted in a suitable envelope.

It is to be noted that the contacts 28 and 30 are also shown in FIG. 12 for clarity. In practice, said contacts are usually provided in places beyond the cross-section shown where the electrode layers 14 and 12 are not present above the thin gate oxyde layers 15 and 13 but on the field oxide 3.

The doping of the polycrystalline silicon layer may be carried out during its deposition. However, in most cases this doping occurs automatically during the formation of the source and drain zones 19, 20, 22 and 23.

Of course, many variation of the above-described embodiment may be provided without departing from the scope of this invention. Several steps of the described process which constitute advantageous preferred embodiments, but are not essential for the invention, may be omitted. For example, instead of the ion implantation 6 (see FIG. 2) a diffusion may also be used in which the oxide layer 5 may be omitted. Instead of a field oxide layer 3 present on the semiconductor surface, an oxide pattern may also be used which is locally sunk in the semiconductor surface. In that case, for example, a cross-section as shown in FIG. 13 is obtained instead of the cross-section shown in FIG. 12. Furthermore, the conductivity types of all the zones may (simultaneously) be replaced by their opposite conductivity types insofar as the difference in etching rate of the doping layer 17 with respect to the other layers, in particular with respect to the thermal oxide layer 21, can be realized, which can be verified by those skilled in the art in occurring cases. The provision of the layers 18 and 25, although desired, is not essential.

Figure 14:
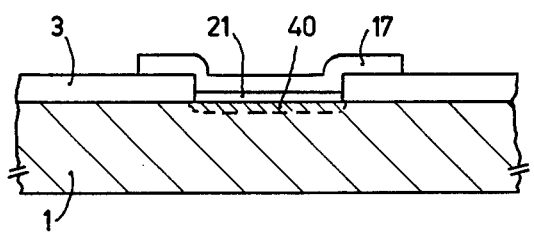
Figure 15:
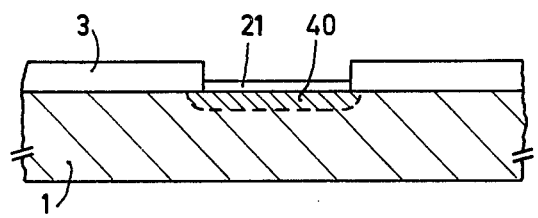

Moreover, the doped zones to be provided need not be of the conductivity type opposite to that of the adjoining semiconductor material. A very simple application of the method according to the invention is shown in FIGS. 14 and 15 in which (see FIG. 14) an n-type zone 40 is formed in an opening in an oxide layer 3 from a doping layer 17, for example of phosphorus glass, in an n-type silicon substrate 1. FIG. 14 shows the situation after the first heating step in an oxidizing atmosphere in which the thermal oxide layer 21 is formed. After etching away the highly doped glass layer 17 without an etching mask, the layers 3 and 21 substantially remaining, the zone 40 is further diffused in the silicon in a second heating step (see FIG. 15), after which contact windows may be etched and contacts be provided on the regions 40 and 1.

The invention is not restricted to silicon; other suitable semiconductor materials can also be used insofar as a suitable thermal oxide layer can be obtained thereon. Instead of phosphorus and boron, other dopants may also be used; instead of an etching liquid for the etching processes, plasma etching may also be used, for example, provided the relative etching rates of the doping layer (17) and the thermal oxide layer (21) satisfy the requirements imposed by the invention. As a variation of the process of FIGS. 1 to 12, for example, the complementary process may be used in which the starting material is a p-type substrate 1 and a n-type region 7, and in which the zones 22 and 23 are n-type conductive and are diffused from a doping layer, while the zones 19 and 20 are p-conductive and are implanted.

What is claimed is:

1. A method of manufacturing a semiconductor device which comprises the steps of:
   providing a semiconductor body;
   providing a diffusion masking layer on a surface of said semiconductor body;
   providing at least one aperture in said masking layer;
   providing an oxide doping layer having a high dopant concentration on the semiconductor surface at least within said aperture;
   diffusing said dopant from the oxide doping layer, through the aperture and into the semiconductor body to form a shallow doped zone having different conductivity properties than those of the adjoining semiconductor material of the semiconductor body by heating the semiconductor body in an oxidizing atmosphere in a first heating step to diffuse part of the dopant from said oxide doping layer into said body while oxidizing the semiconductor surface at least within said aperture to form a weakly doped thermal oxide layer thereon to limit the further diffusion of said dopant from the oxide doping layer into the semiconductor body and thereby limit the growth of said shallow doped zone, the oxide doping layer containing a sufficiently high dopant concentration to have a higher etch rate than that of either the diffusion masking layer or the thermal oxide layer;
   removing the oxide doping layer by an etching process without using an etching mask, the diffusion masking layer and the thermal oxide layer being removed at most over only a part of their thickness by said etching process; and
   further diffusing said dopant into the semiconductor body by again heating said body in a second heating step.

2. A method as claimed in claim 1 wherein the doped zone has an opposite conductivity type with respect to the adjoining semiconductor material.

3. A method as claimed in claim 1, wherein a doped silicon oxide layer is deposited pyrolytically to provide said doping layer.

4. A method as claimed in claim 1, wherein after providing the doping layer an undoped silicon oxide layer is provided on said doping layer in the same operational step.

5. A method as claimed in claim 1, wherein after removing the doping layer and prior to the second heating step a phosphorus-doped passivating glass layer is provided over the whole surface.

6. A method as claimed in claim 1, wherein at least first and second apertures are provided in the masking layer and the doping layer is provided only in the first aperture, during the first heating step the thermal oxide layer is formed within the first and second apertures, after the first heating step a second dopant is provided by ion implantation via the second aperture and the thermal oxide layer formed therein to form a second doped zone, said doping layer masking against said ion implantation, after which during the second heating step the second dopant is further diffused into the semiconductor body simultaneously with the first dopant.

7. A method as claimed in claim 6, wherein first and second doped zones are provided which have an opposite conductivity type with respect to that of the adjoining semiconductor material.

8. A method as claimed in claim 6 wherein a first doped zone of a first conductivity type and a second doped zone of a second conductivity type are provided.

9. A method as claimed in claim 8, wherein the starting material is a semiconductor body having a surface-adjoining first region of the second conductivity type which within the semiconductor body is surrounded entirely by a surface-adjoining second region of the first conductivity type, at least two first apertures are provided above the first region so as to form at least the source and drain zones of a first insulated gate field effect transistor, and at least two second apertures are provided above the second region so as to form at least the source and drain zones of a second insulated gate field effected transistor which is complementary to the first, and said masking layer is formed by insulating layer portions present outside the first and second apertures and by insulated gate electrodes which mutually separate the first apertures and mutually separate the second apertures from each other.

10. A method as claimed in claim 6, wherein phosphorus is indiffused as a first dopant.

11. A method as claimed in claim 6, wherein boron is implanted as a second dopant.

12. A method as claimed in claim 6, wherein the second heating step is also carried out in an oxidizing atmosphere, to form a thermal oxide layer on the semiconductor surface present within the second aperture.

* * * * *